United States Patent
Asami et al.

(10) Patent No.: US 12,381,265 B2
(45) Date of Patent: Aug. 5, 2025

(54) STORAGE BATTERY APPARATUS

(71) Applicant: KABUSHIKI KAISHA TOSHIBA, Tokyo (JP)

(72) Inventors: Kota Asami, Tokyo (JP); Kazuto Kuroda, Tokyo (JP); Yusuke Kikuchi, Kawasaki (JP); Ryo Nozawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 607 days.

(21) Appl. No.: 17/654,859

(22) Filed: Mar. 15, 2022

(65) Prior Publication Data

US 2022/0200069 A1 Jun. 23, 2022

Related U.S. Application Data

(63) Continuation of application No. PCT/JP2019/036400, filed on Sep. 17, 2019.

(51) Int. Cl.
*H01M 10/48* (2006.01)
*G01K 13/00* (2021.01)
(Continued)

(52) U.S. Cl.
CPC .......... *H01M 10/482* (2013.01); *G01K 13/00* (2013.01); *G01R 31/3842* (2019.01);
(Continued)

(58) Field of Classification Search
CPC ............. H01M 10/482; H01M 10/425; H01M 10/486; H04W 4/80; G01R 31/396; G01R 31/3842

See application file for complete search history.

(56) References Cited

U.S. PATENT DOCUMENTS

2016/0174346 A1 6/2016 Koriyama et al.
2017/0139014 A1 5/2017 Yamamoto et al.
(Continued)

FOREIGN PATENT DOCUMENTS

CN 110166070 A 8/2019
JP 2015-41 438 A 3/2015
(Continued)

OTHER PUBLICATIONS

International Search Report issued Dec. 10, 2019 in PCT/JP2019/036400, filed on Sep. 17, 2019, 1 page.
(Continued)

*Primary Examiner* — Karie O'Neill Apicella
(74) *Attorney, Agent, or Firm* — Maier & Maier, PLLC (57) ABSTRACT

According to one embodiment, a storage battery apparatus comprising: a plurality of storage battery modules, each of which includes a battery module and a first wireless communication module transmitting and receiving a radio wave based on a BLE standard; and a battery management unit which includes a plurality of second wireless communication modules transmitting and receiving a radio wave based on the BLE standard, and an arithmetic processing apparatus controlling operation of the second wireless communication modules, wherein the arithmetic processing apparatus establishes communication between the battery management unit and the storage battery modules in unit of groups each including at least one of the storage battery modules.

1 Claim, 9 Drawing Sheets

(51) Int. Cl.
  *G01R 31/3842*   (2019.01)
  *G01R 31/396*    (2019.01)
  *H01M 10/42*     (2006.01)
  *H02J 13/00*     (2006.01)
  *H04W 4/80*      (2018.01)

(52) U.S. Cl.
  CPC ........ *G01R 31/396* (2019.01); *H01M 10/425* (2013.01); *H01M 10/486* (2013.01); *H02J 13/00026* (2020.01); *H04W 4/80* (2018.02); *H01M 2010/4271* (2013.01); *H01M 2010/4278* (2013.01)

(56) References Cited

U.S. PATENT DOCUMENTS

2019/0252734 A1*  8/2019  Razzell ............... H01M 10/425
2020/0064408 A1   2/2020  Sato

FOREIGN PATENT DOCUMENTS

JP    2018-61303 A    4/2018
JP    2018-073691 A   5/2018

OTHER PUBLICATIONS

Extended European Search Report dated Aug. 18, 2022, corresponding to European Application No. 19945960.3; 12 pages.

\* cited by examiner

STORAGE BATTERY APPARATUS

CROSS-REFERENCE TO RELATED APPLICATIONS

This is a Continuation Application of PCT Application No. PCT/JP2019/036400, filed Sep. 17, 2019, the entire contents of which are incorporated herein by reference.

FIELD

The present embodiment relates to a storage battery apparatus.

BACKGROUND

A storage battery apparatus obtained by combining a plurality of storage battery modules is used for various purposes. In recent years, for the purpose of simplifying a configuration of the storage battery apparatus, it has been studied to achieve wireless communication between a storage battery module and a management apparatus using radio waves.

The storage battery module includes a monitoring circuit which measures a voltage and a temperature of a battery, and a communication module. In a case where the storage battery module is not connected in a wired manner, the monitoring circuit and the communication module obtain power supply from a battery mounted on the storage battery module. Energy stored in the battery is preferably efficiently supplied to a load, and thus, it is required to reduce energy consumption at the monitoring circuit and the communication module.

For example, Bluetooth low energy (BLE) is known as a wireless communication standard which saves power consumption. In the BLE, a communication band of 2.4 GHz is divided into 40 channels and used. Three channels included among the 40 channels are used as advertising channels for discovering a communication partner and controlling network participation or for broadcasting. The remaining 37 channels are used as data channels for data communication after connection.

For example, in a case where communication is performed using a control area network (CAN), data which is simultaneously transmitted from a plurality of storage battery modules to be managed by a management apparatus can be received by assigning priority to the plurality of storage battery modules. However, in a case where communication is performed using the BLE, it is not possible to assign priority to a plurality of storage battery modules, and thus, there is a possibility that the management apparatus cannot receive advertisement packets which are simultaneously transmitted from the plurality of storage battery modules.

In facilities such as substations where several hundred storage battery modules need to be managed, the management apparatus may include (become multi-master) a plurality of communication modules. In order to establish connections between the management apparatus and the storage battery modules under such an environment, the management apparatus needs to select the storage battery module to be managed from the advertisement packets concentrated in the advertisement channels of three channels, and it takes time to establish the connections between the management apparatus and all the storage battery modules, which causes decrease in reliability of the storage battery apparatus.

In addition, for example, in a case where the management apparatus establishes connections with a plurality of storage battery modules, there is a possibility that the plurality of storage battery modules transmits advertisement packets using the same channel at the same timing. In this case, the advertisement packets transmitted from the plurality of storage battery modules collide and cancel each other, and thus, the management apparatus and the storage battery modules lose an opportunity of connections.

For example, in a case where a plurality of wireless communication modules and the plurality of storage battery modules (observer (Ob)) perform wireless communication using radio waves using the plurality of wireless communication modules of the management apparatus as broadcasters (Br), the management apparatus (broadcaster (Br)) can periodically transmit an advertisement packet, so that a connection can be retried even if a connection opportunity is lost once. However, in a case where a plurality of wireless communication modules tries to establish connections with several hundreds of storage battery modules at the same time, retry is repeated because advertisement packets are concentrated on the advertisement channels of three channels, which delays a timing at which the management apparatus starts management of the storage battery modules. It is not possible to monitor the voltage and the temperature of the battery with respect to the storage battery module with which a connection is not established, and it is difficult to ensure safety of the storage battery apparatus.

For example, in a case where information on a storage battery module to be connected is included in the advertisement packet received by one wireless communication module, the wireless communication module transmits a connection request to the storage battery module. In a case where a packet of the connection request is transmitted from the wireless communication module, the advertisement channels of three channels are used, and thus, there is a possibility that the packet of the connection request and the advertisement packet collide with each other. If the packets collide, the packet of the connection request transmitted from the wireless communication module is not received by the storage battery module, so that the connection is not established, and the wireless communication module starts again from a stage of receiving the advertisement packet. Even in such a case, the timing at which the management apparatus starts management of the storage battery modules is delayed, and the voltage and the temperature of the battery cannot be monitored with respect to the storage battery module with which a connection is not established, and it is difficult to ensure safety of the storage battery apparatus.

DETAILED DESCRIPTION

An example of the storage battery apparatus according to an embodiment will be described in detail below with reference to the drawings.

Figure 1:
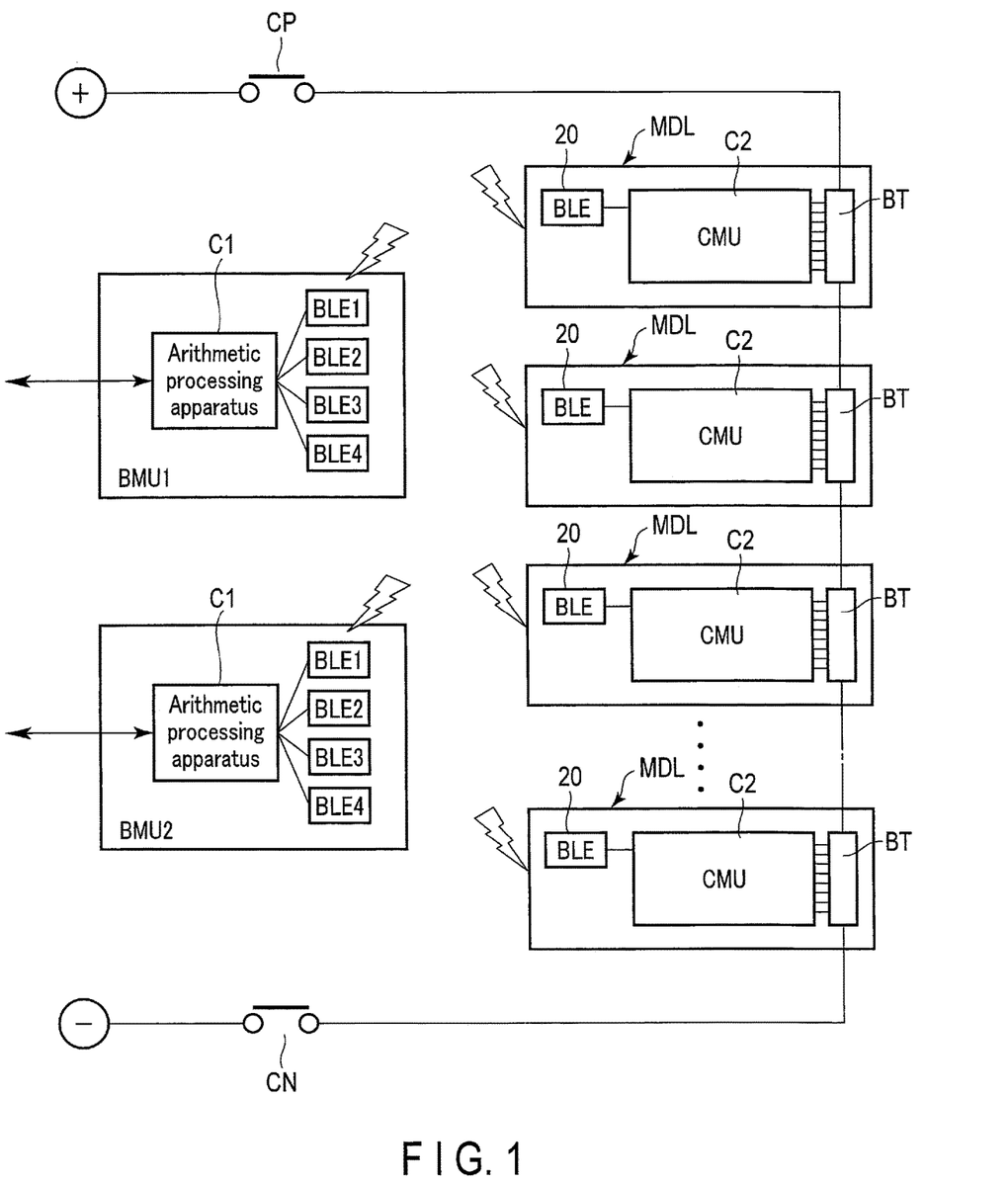
FIG. 1 is a diagram schematically illustrating a configuration example of a storage battery apparatus according to an embodiment.

FIG. 1 is a diagram schematically illustrating a configuration example of a storage battery apparatus according to an embodiment.

The storage battery apparatus of the present embodiment includes a plurality of storage battery modules MDL, a plurality of battery management units BMU1 and BMU2, a first contactor CP, and a second contactor CN.

The storage battery module MDL includes a battery module BT including a plurality of battery cells, a cell monitoring unit (CMU) C2, and a wireless communication module (a first wireless communication module) 20.

The battery module BT includes, for example, a plurality of battery cells of lithium ion batteries connected in series or in parallel.

The wireless communication module 20 can perform communication (transmission and reception) using radio waves with any of the plurality of battery management units BMU1 and BMU2. In the storage battery apparatus of the present embodiment, the wireless communication module 20 can communicate with one of the battery management units BMU1 and BMU2 based on the BLE standard.

The cell monitoring unit C2 includes a measurement circuit (not illustrated) that detects a voltage of each of the plurality of battery cells and a temperature of at least one portion of the battery module BT, and an arithmetic processing apparatus (not illustrated), and can periodically transmit the measurement values of the voltage and the temperature to the battery management units BMU1 and BMU2 via the wireless communication module 20.

In addition, the cell monitoring unit C2 equalizes the voltages (cell balance) of the plurality of battery cells based on a control signal received from the battery management units BMU1 and BMU2 via the wireless communication module 20.

An arithmetic processing apparatus of the cell monitoring unit C2 may be configured with, for example, hardware, software, or a combination of hardware and software. The arithmetic processing apparatus of the cell monitoring unit C2 is a circuit which includes, for example, at least one processor such as a CPU and an MPU, and a memory in which a program to be executed by the processor is recorded, and which realizes the above operation by software.

The first contactor CP is interposed in a main circuit which connects a terminal on the highest electric potential side of the plurality of storage battery modules MDL and a positive electrode terminal of the storage battery apparatus, and can switch an electrical connection between the plurality of storage battery modules MDL and the positive electrode terminal. The first contactor CP is controlled to open and close the contact by a control signal from the battery management units BMU1 and BMU2.

The second contactor CN is interposed in a main circuit which connects a terminal on the lowest electric potential side of the plurality of storage battery modules MDL and a negative electrode terminal of the storage battery apparatus, and can switch an electrical connection between the plurality of storage battery modules MDL and the negative electrode terminal. The second contactor CN is controlled to open and close the contact by a control signal from the battery management units BMU1 and BMU2.

Each of the battery management units BMU1 and BMU2 includes a plurality of wireless communication modules (second wireless communication modules) BLE1 to BLE4 and an arithmetic processing apparatus C1.

Figure 2A:
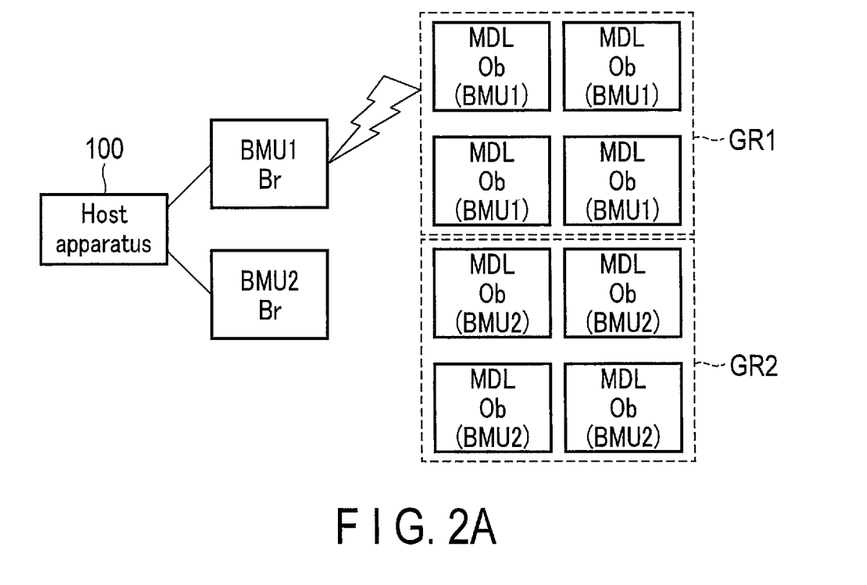
FIG. 2A is a diagram for explaining an example of procedure of performing communication between a battery management unit and a plurality of storage battery modules in the storage battery apparatus of a first embodiment.
Figure 2B:
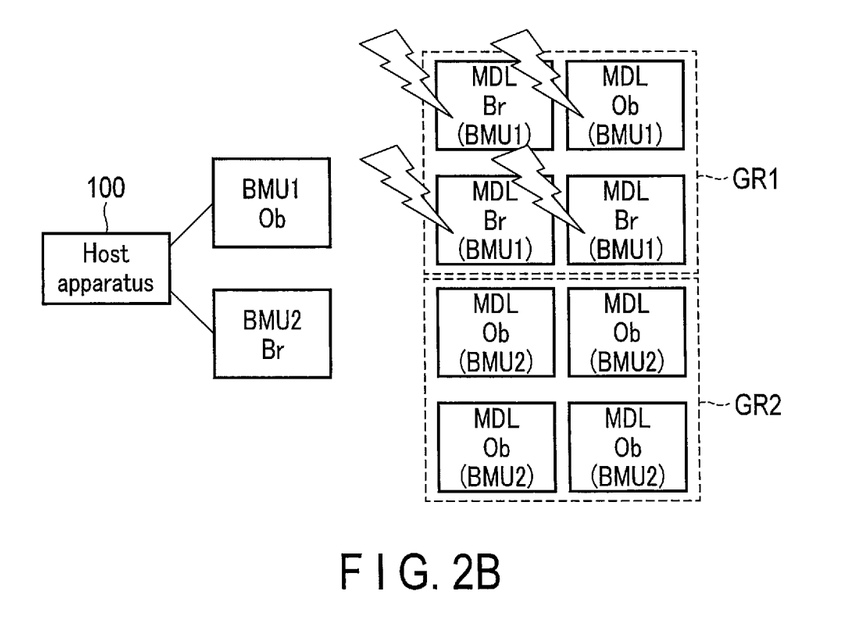
FIG. 2B is a diagram for explaining an example of procedure of performing communication between a battery management unit and a plurality of storage battery modules in the storage battery apparatus of the first embodiment.

The arithmetic processing apparatus C1 includes a communication circuit (not illustrated) capable of performing wired communication with a host apparatus 100 (illustrated in FIG. 2, and the like). The arithmetic processing apparatus C1 can receive various kinds of control signals from the host apparatus 100 and can control operation of the plurality of cell monitoring units C2, the first contactor CP, and the second contactor CN based on the received information.

The arithmetic processing apparatus C1 periodically receives detection values of the voltages of the plurality of battery cells and a detection value of the temperature of the battery module BT from each of the plurality of cell monitoring units C2, and periodically receives detection value of current flowing through the plurality of battery modules BT from the current sensor SS. The battery management units BMU1 and BMU2 can calculate a state of charge (SOC) and a state of health (SOH) of the battery module BT (or the battery cell) based on the received values.

The arithmetic processing apparatus C1 monitors voltages of the plurality of battery cells and currents flowing through the plurality of battery modules BT, and controls the cell monitoring units C2 so as to equalize the voltages of the plurality of battery cells. For example, the battery management units BMU1 and BMU2 control operation of the storage battery apparatus so that the battery cell is not in an abnormal state such as over-charge and over-discharge.

The arithmetic processing apparatus C1 may be configured with hardware, software, or a combination of hardware and software. The arithmetic processing apparatus C1 may include, for example, at least one processor, and a memory in which a program to be executed by the processor is recorded.

The plurality of wireless communication modules BLE1 to BLE4 perform communication (transmission and reception) using radio waves with the wireless communication modules 20 of the plurality of cell monitoring units C2. In the storage battery apparatus of the present embodiment, the wireless communication modules BLE1 to BLE4 communicate with the wireless communication modules 20 of the plurality of cell monitoring units C2 based on the BLE standard.

Next, an example of operation of performing communication between the battery management units BMU1 and BMU2 and the plurality of storage battery modules MDL in the storage battery apparatus of the present embodiment will be described.

FIGS. 2A and 2B are diagrams for explaining an example of procedure of performing communication between a battery management unit and a plurality of storage battery modules in the storage battery apparatus of the first embodiment.

Figure 3:
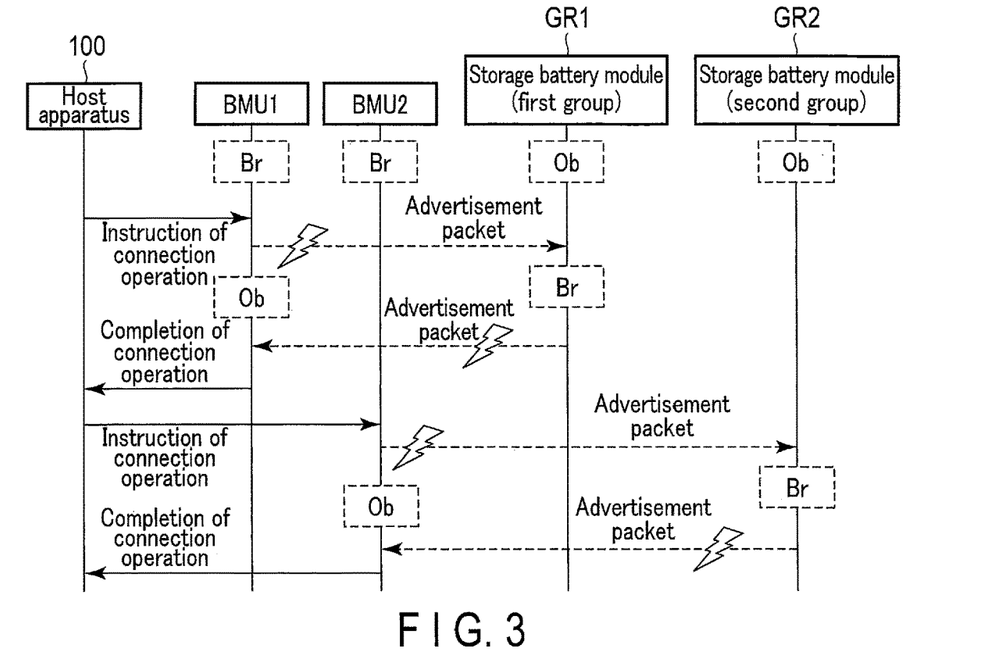
FIG. 3 is a timing chart for explaining an example of procedure of performing communication between the battery management unit and the plurality of storage battery modules in the storage battery apparatus of the first embodiment.

FIG. 3 is a timing chart for explaining an example of procedure of performing communication between the battery management unit and the plurality of storage battery modules in the storage battery apparatus of the first embodiment.

Here, for example, an example of the operation of the storage battery apparatus in a case where the plurality of storage battery modules MDL is divided into a first group GR1 to be managed by the battery management unit BMU1 and a second group GR2 to be managed by the battery management unit BMU2, and communication is sequentially established for each group of the plurality of storage battery modules MDL will be described.

The battery management units BMU1 and BMU2 sequentially establish communication for each group of the plurality of storage battery modules MDL in the order based on a command from the host apparatus 100 provided outside the storage battery apparatus.

First, the wireless communication modules BLE1 to BLE4 of the battery management units BMU1 and BMU2 are set as broadcasters (Br), and the wireless communication modules 20 of the plurality of storage battery modules MDL are set as observers (Ob).

The host apparatus 100 transmits a command which instructs the battery management unit BMU1 to perform connection operation.

When the arithmetic processing apparatus C1 of the battery management unit BMU1 receives the instruction of the connection operation from the host apparatus 100, the arithmetic processing apparatus C1 transmits an advertisement packet via the wireless communication modules BLE1 to BLE4. In this event, the arithmetic processing apparatus C1 periodically transmits the advertisement packet via the wireless communication modules BLE1 to BLE4. The advertisement packet transmitted from the arithmetic processing apparatus C1 includes, for example, data indicating that a connection is requested to the storage battery module MDL in the first group GR1.

A cycle in which the advertisement packet is transmitted from each of the wireless communication modules BLE1 to BLE4 is controlled by an advertisement interval (T_advEvent). The advertisement interval is set by the following expression (1) using, for example, values of advInterval and advDelay.

$$T\_advEvent = advInterval + advDelay \tag{1}$$

Here, advInterval is a value which can be set in accordance with product design, and is set at, for example, a value from 20 ms to 10.24 s. advDelay is randomly used, for example, from a value from 0 ms to 10 ms. As described above, the advertisement interval is different among the plurality of wireless communication modules BLE1 to BLE4 depending on the value of advDelay which is randomly set, and thus, a timing at which the advertisement packet is transmitted is shifted, which can prevent packet collision.

A state of the battery management unit BMU1 changes from a state of the broadcaster to a state of the observer after a predetermined period has elapsed after the advertisement packet has been periodically transmitted.

The plurality of storage battery modules MDL is initially in the state of the observer (Ob), and can receive the advertisement packet. In a case where the cell monitoring unit C2 of the storage battery module MDL receives the advertisement packet via the wireless communication module 20, the cell monitoring unit C2 determines whether or not the advertisement packet is transmitted to the group to which the cell monitoring unit C2 belongs.

In a case where the cell monitoring unit C2 of the storage battery module MDL included in the first group GR1 receives the advertisement packet via the wireless communication module 20 and determines that the advertisement packet is transmitted to the storage battery module MDL in the first group GR, the state becomes the state of the broadcaster from the state of the observer.

Subsequently, the cell monitoring unit C2 of the storage battery module MDL included in the first group GR1 transmits the advertisement packet via the wireless communication module 20. In this event, the advertisement packet transmitted from the cell monitoring unit C2 includes, for example, data for identifying the plurality of storage battery modules MDL included in the first group GR1.

In this event, the battery management unit BMU1 is in a state of the observer and can receive the advertisement packet. In a case where the arithmetic processing apparatus C1 of the battery management unit BMU1 receives the advertisement packet via the wireless communication modules BLE1 to BLE4, the arithmetic processing apparatus C1 confirms whether the advertisement packet is transmitted from the storage battery module MDL included in the first group GR1.

In a case where the arithmetic processing apparatus C1 confirms that the packet is an advertisement packet from the storage battery module MDL to be managed, the arithmetic processing apparatus C1 allocates the packet to any one of the wireless communication modules BLE1 to BLE4, and sequentially performs connection operation with all the storage battery modules MDL in the first group GR1.

After the arithmetic processing apparatus C1 establishes connections with all the storage battery modules MDL in the first group GR1 to be managed, the arithmetic processing apparatus C1 notifies the host apparatus 100 that the connection operation has been completed.

For example, in a case where the advertisement packets are not received from all the storage battery modules MDL in the group to be managed until a predetermined period elapses since the advertisement packet has been transmitted, the arithmetic processing apparatus C1 may notify the host apparatus 100 that the connection operation has been failed. In a case where connections cannot be established with all the storage battery modules MDL even if retry of the connection operation is performed a predetermined number of times, it is possible to notify the host apparatus 100 that the storage battery module MDL to be managed is abnormal.

In a case where the host apparatus 100 receives the notification that the connection operation has been completed from the arithmetic processing apparatus C1 of the battery management unit BMU1, the host apparatus 100 transmits a command instructing the battery management unit BMU2 to perform the connection operation.

The arithmetic processing apparatus C1 of the battery management unit BMU2 establishes connections with the storage battery modules MDL in the second group GR2 to be managed, in a similar manner to the battery management unit BMU1.

As described above, it is possible to prevent collision of the advertisement packets by performing connection operation at different timings at the plurality of battery management units BMU1 and BMU2. In addition, the plurality of battery management units BMU1 and BMU2 establish connections with the storage battery modules MDL, which results in reduction of the number of storage battery modules MDL to be managed by each of the battery management units BMU1 and BMU2, so that it is possible to prevent collision between the advertisement packet which requests a connection and the advertisement packet which responds to the connection request.

As a result, it is possible to shorten a period for completing connections between the battery management units BMU1 and BMU2 and the plurality of storage battery modules MDL, so that it is possible to shorten a period for causing a system to operate. In other words, according to the present embodiment, it is possible to provide a storage battery apparatus with high reliability.

Next, a storage battery apparatus according to a second embodiment will be described in detail with reference to the drawings.

The storage battery apparatus of the present embodiment is different from the storage battery apparatus in the first embodiment in connection operation between the battery management units BMU1 and BMU2 and the storage battery modules MDL.

Figure 4:
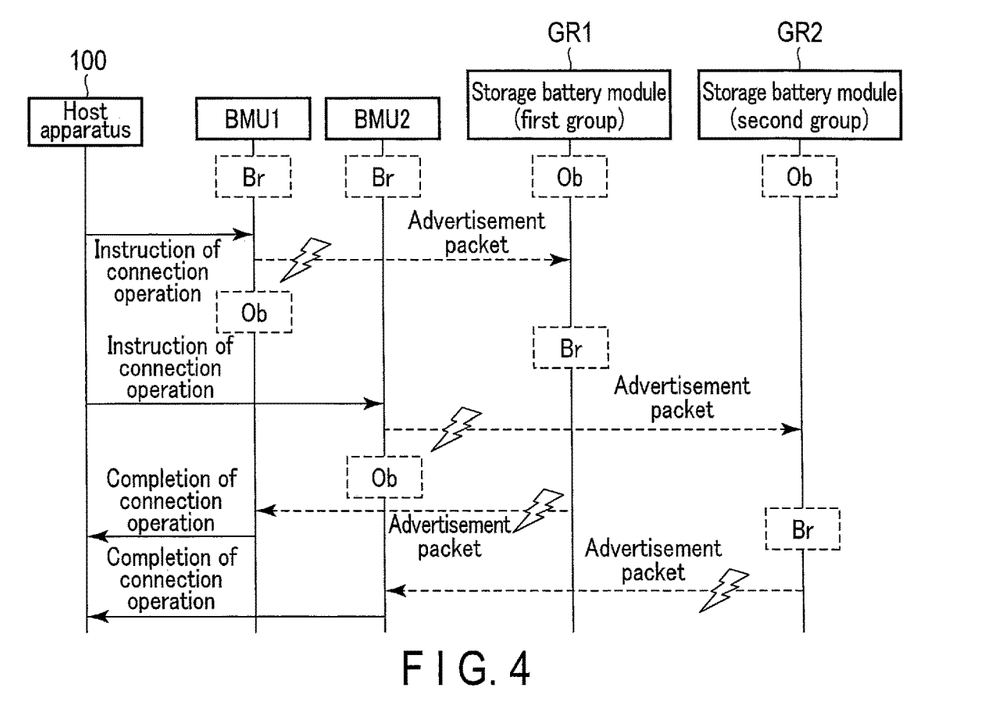
FIG. 4 is a timing chart for explaining an example of procedure of performing communication between the battery management unit and the plurality of storage battery modules in the storage battery apparatus of a second embodiment.

FIG. 4 is a timing chart for explaining an example of procedure of performing communication between the battery management unit and the plurality of storage battery modules in the storage battery apparatus of the second embodiment.

In the present embodiment, for example, an example of the operation of the storage battery apparatus in a case where the plurality of storage battery modules MDL is divided into a first group GR1 to be managed by the battery management unit BMU1 and a second group GR2 to be managed by the battery management unit BMU2, and connection is established in parallel for the group of the plurality of storage battery modules MDL will be described.

The battery management units BMU1 and BMU2 establish communication in parallel for each group of the plurality of storage battery modules MDL based on a command from the host apparatus 100 provided outside the storage battery apparatus.

First, the wireless communication modules BLE1 to BLE4 of the battery management units BMU1 and BMU2 are set as broadcasters (Br), and the wireless communication modules 20 of the plurality of storage battery modules MDL are set as observers (Ob).

The host apparatus 100 transmits a command which instructs the battery management unit BMU1 to perform connection operation, and transmits a command which instructs the battery management unit BMU2 to perform connection operation after a predetermined period has elapsed. At this time, even if the host apparatus 100 has not received yet the notification that the connection operation was completed from the battery management unit BMU1, the host apparatus 100 transmits a command instructing the battery management unit BMU2 to perform the connection operation.

In the storage battery apparatus of the present embodiment, for example, a timing of the command can be adjusted such that a timing at which the advertisement packet returned from the storage battery module MDL in the first group GR1 is transmitted in response to the advertisement packet transmitted from the battery management unit BMU1 becomes different from a timing at which the advertisement packet is transmitted from the battery management unit BMU2.

The storage battery apparatus of the present embodiment is similar to the storage battery apparatus in the above-described first embodiment except for the above-described operation of the host apparatus 100.

In the storage battery apparatus of the present embodiment, there is a period in which a connection between the battery management unit BMU1 and the storage battery module MDL in the first group GR1 and a connection between the battery management unit BMU2 and the storage battery module MDL in the second group are established in parallel.

A timing at which the command is transmitted from the host apparatus 100 to the battery management unit BMU1 is different from a timing at which the command is transmitted to the battery management unit BMU2, and thus, a time difference occurs between the timing at which the battery management unit BMU1 transmits the advertisement packet and the timing at which the battery management unit BMU2 transmits the advertisement packet. This can prevent collision between the advertisement packets.

In addition, the number of storage battery modules MDL to be managed by each of the battery management units BMU1 and BMU2 is reduced, so that it is possible to prevent collision between the advertisement packet which requests a connection and the advertisement packet which responds to the connection request.

As a result, it is possible to shorten a period for completing connections between the battery management units BMU1 and BMU2 and the plurality of storage battery modules MDL, so that it is possible to shorten a period for causing a system to operate. In other words, according to the present embodiment, it is possible to provide a storage battery apparatus with high reliability.

Next, a storage battery apparatus according to a third embodiment will be described in detail with reference to the drawings.

Figure 5A:
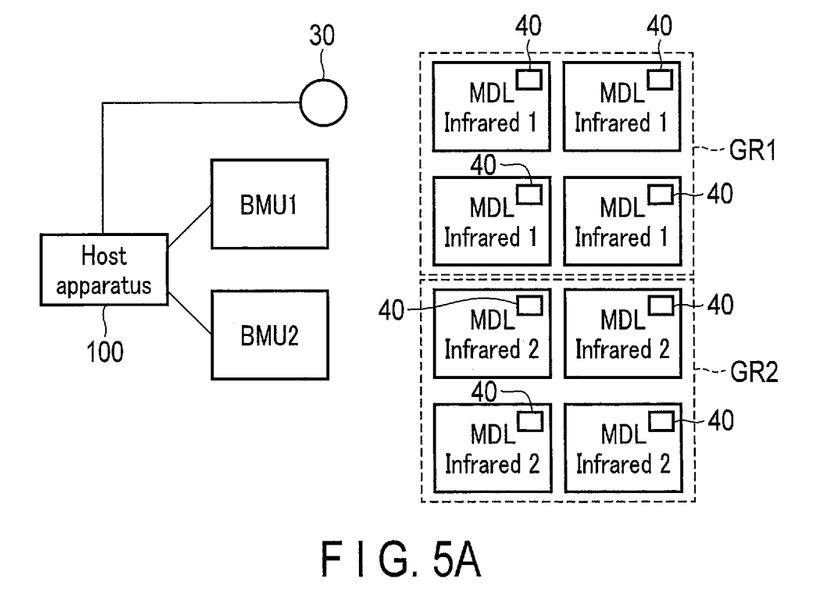
FIG. 5A is a diagram for explaining an example of procedure of performing communication between a battery management unit and a plurality of storage battery modules in the storage battery apparatus of a third embodiment.
Figure 5B:
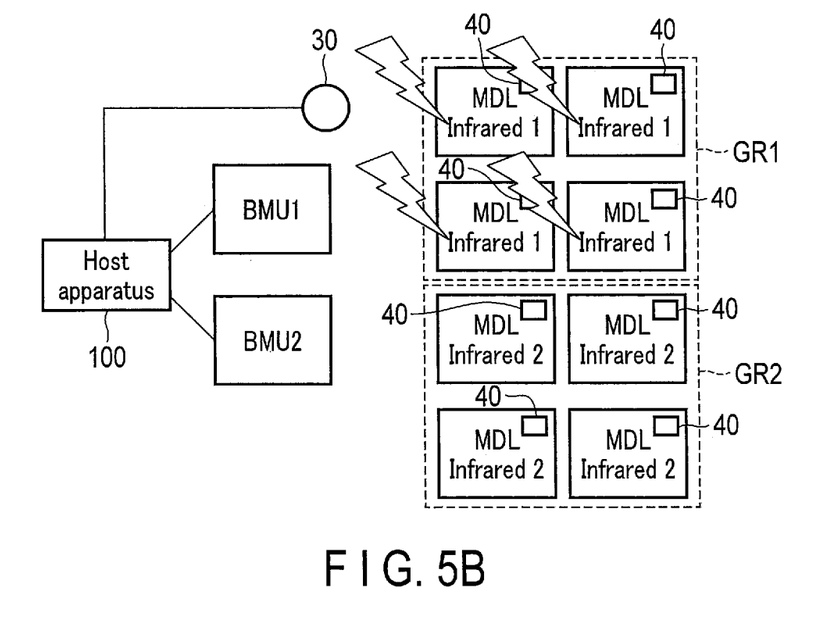
FIG. 5B is a diagram for explaining an example of procedure of performing communication between a battery management unit and a plurality of storage battery modules in the storage battery apparatus of the third embodiment.

FIGS. 5A and 5B are diagrams for explaining an example of procedure of performing communication between a battery management unit and a plurality of storage battery modules in the storage battery apparatus of the third embodiment.

In the storage battery apparatus of the present embodiment, the plurality of storage battery modules MDL further includes the infrared receivers 40. The infrared receivers 40 can receive infrared signals (for example, pulse position modulation (PPM) signals) transmitted from an infrared transmitter 30 of the host apparatus 100.

Figure 6:
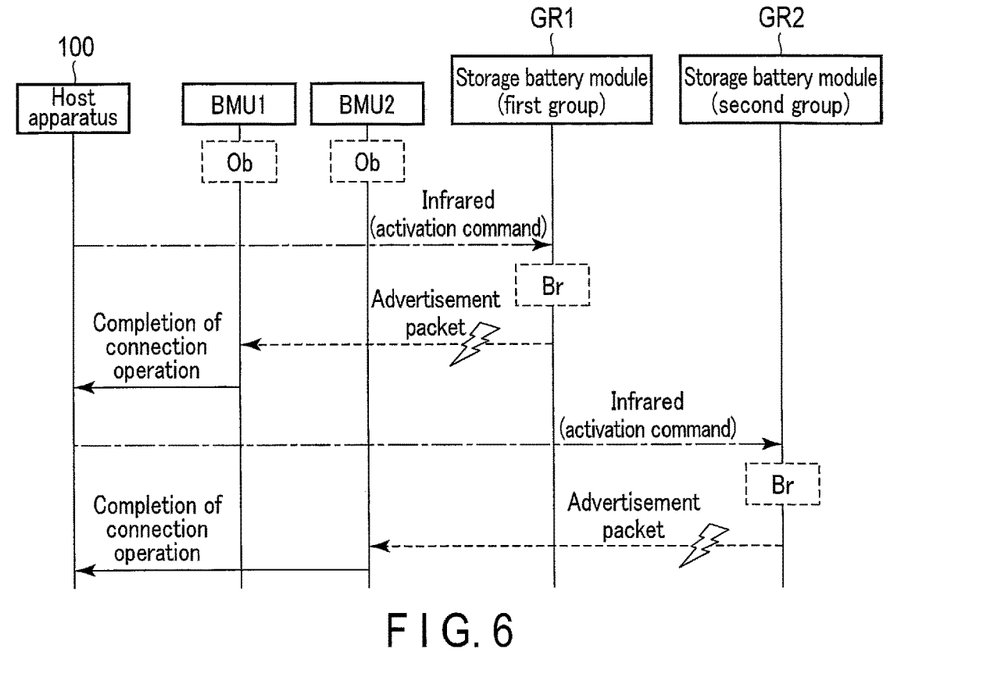
FIG. 6 is a timing chart for explaining an example of procedure of performing communication between the battery management unit and the plurality of storage battery modules in the storage battery apparatus of the third embodiment.

FIG. 6 is a timing chart for explaining an example of procedure of performing communication between the battery management unit and the plurality of storage battery modules in the storage battery apparatus of the third embodiment.

Here, for example, an example of operation of the storage battery apparatus in a case where the plurality of storage battery modules MDL is divided into a first group GR1 to be managed by the battery management unit BMU1 and a second group GR2 to be managed by the battery management unit BMU2, and activated by the infrared signal for each group of the plurality of storage battery modules MDL to sequentially establish connections will be described.

First, the wireless communication modules BLE1 to BLE4 of the battery management units BMU1 and BMU2 are set as observers (Ob), and the plurality of storage battery modules MDL put the infrared receivers 40 into a standby state, and put components other than the infrared receivers 40 in a state where the components are not activated.

The host apparatus 100 outputs an infrared signal for activating the plurality of storage battery modules MDL in the first group GR1 from the infrared transmitter 30.

The plurality of storage battery modules MDL in the first group GR1 are energized by receiving the infrared signal from the host apparatus 100 by the infrared receiver 40, and the cell monitoring unit C2 and the wireless communication module 20 are activated. The wireless communication module 20 is in a state of a broadcaster (Br) when the storage battery module MDL is activated.

The cell monitoring unit C2 of the activated storage battery module MDL causes the wireless communication module 20 to transmit the advertisement packet. The advertisement packet is periodically transmitted from the wireless communication module 20.

A cycle in which the advertisement packet is transmitted from the wireless communication module 20 of the plurality of storage battery modules MDL is controlled by an advertisement interval (T_advEvent). The advertisement interval is set by the above expression (1) using, for example, values of advInterval and advDelay. Similarly to the first embodiment described above, the advertisement interval is different among the plurality of wireless communication modules 20 depending on the value of advDelay which is randomly set, and thus, a timing at which the advertisement packet is transmitted is shifted, which can prevent packet collision.

The battery management unit BMU1 is at first in a state of an observer (Ob) and can receive an advertisement packet. In a case where the arithmetic processing apparatus C1 of the battery management unit BMU1 receives the advertisement packet via the wireless communication modules BLE1 to BLE4, the arithmetic processing apparatus C1 determines whether or not the advertisement packet is transmitted from the storage battery module MDL to be managed.

The battery management unit BMU1 receives the advertisement packet via the wireless communication modules BLE1 to BLE4, determines that the advertisement packet is transmitted from the storage battery module MDL in the first group GR1, and notifies the host apparatus 100 that the connection operation has been completed in a case where the battery management unit BMU1 receives the advertisement packets from all the storage battery modules MDL.

Subsequently, the plurality of storage battery modules MDL in the second group GR2 establishes connections with the battery management unit BMU2.

The host apparatus 100 outputs an infrared signal for activating the plurality of storage battery modules MDL in the second group GR2 from the infrared transmitter 30.

The plurality of storage battery modules MDL in the second group GR2 are energized by receiving the infrared signal from the host apparatus 100 by the infrared receiver 40, and the cell monitoring unit C2 and the wireless communication module 20 are activated. The wireless communication module 20 is in a state of a broadcaster (Br) when the storage battery module MDL is activated.

The cell monitoring unit C2 of the activated storage battery module MDL causes the wireless communication module 20 to transmit the advertisement packet. The advertisement packet is periodically transmitted from the wireless communication module 20.

A cycle in which the advertisement packet is transmitted from the wireless communication module 20 of the plurality of storage battery modules MDL is controlled by an advertisement interval (T_advEvent). The advertisement interval is set by the above expression (1) using, for example, values of advInterval and advDelay. Similarly to the first embodiment described above, the advertisement interval is different among the plurality of wireless communication modules 20 depending on the value of advDelay which is randomly set, and thus, a timing at which the advertisement packet is transmitted is shifted, which can prevent packet collision.

The battery management unit BMU2 is at first in a state of an observer (Ob) and can receive an advertisement packet. In a case where the arithmetic processing apparatus C1 of the battery management unit BMU2 receives the advertisement packet via the wireless communication modules BLE1 to BLE4, the arithmetic processing apparatus C1 determines whether or not the advertisement packet is transmitted from the storage battery module MDL to be managed.

The battery management unit BMU2 receives the advertisement packet via the wireless communication modules BLE1 to BLE4, determines that the advertisement packet is transmitted from the storage battery module MDL in the second group GR2, and notifies the host apparatus 100 that the connection operation has been completed in a case where the battery management unit BMU2 receives the advertisement packets from all the storage battery modules MDL.

Additionally, for example, in a case where the advertisement packets are not received from all the storage battery modules MDL in the group to be managed until a predetermined period elapses since the first advertisement packet has been received, the arithmetic processing apparatus C1 may notify the host apparatus 100 that the connection operation has been failed. In a case where connections cannot be established with all the storage battery modules MDL even if retry of the connection operation is performed a predetermined number of times, it is possible to notify the host apparatus 100 that the storage battery module MDL to be managed is abnormal.

As described above, it is possible to prevent collision of the advertisement packets by performing the connection operation at different timings at the plurality of battery management units BMU1 and BMU2. The advertisement packet from the storage battery module MDL in the first group GR1 to which the battery management unit BMU1 is connected and the advertisement packet from the storage battery module MDL in the second group GR2 to which the battery management unit BMU2 is connected have different timings, and thus, packet collision does not occur between the storage battery module MDL in the first group GR1 and the storage battery module MDL in the second group GR2. In addition, the battery management unit BMU2 does not make a connection request to the storage battery module MDL in the first group GR1, no collision occurs between a packet of the connection request from the battery management unit BMU2 and the advertisement packet from the storage battery module MDL in the first group GR1. In a similar manner, the battery management unit BMU1 does not make a connection request to the storage battery module MDL in the second group GR2, no collision occurs between a packet of the connection request from the battery management unit BMU1 and the advertisement packet from the storage battery module MDL in the second group GR2.

As a result, it is possible to shorten a period for completing connections between the battery management units BMU1 and BMU2 and the plurality of storage battery modules MDL, so that it is possible to shorten a period for causing a system to operate. In other words, according to the present embodiment, it is possible to provide a storage battery apparatus with high reliability.

Next, a storage battery apparatus according to a fourth embodiment will be described in detail with reference to the drawings.

The storage battery apparatus of the present embodiment is different from the storage battery apparatus in the third embodiment in connection operation between the battery management units BMU1 and BMU2 and the storage battery modules MDL.

Figure 7:
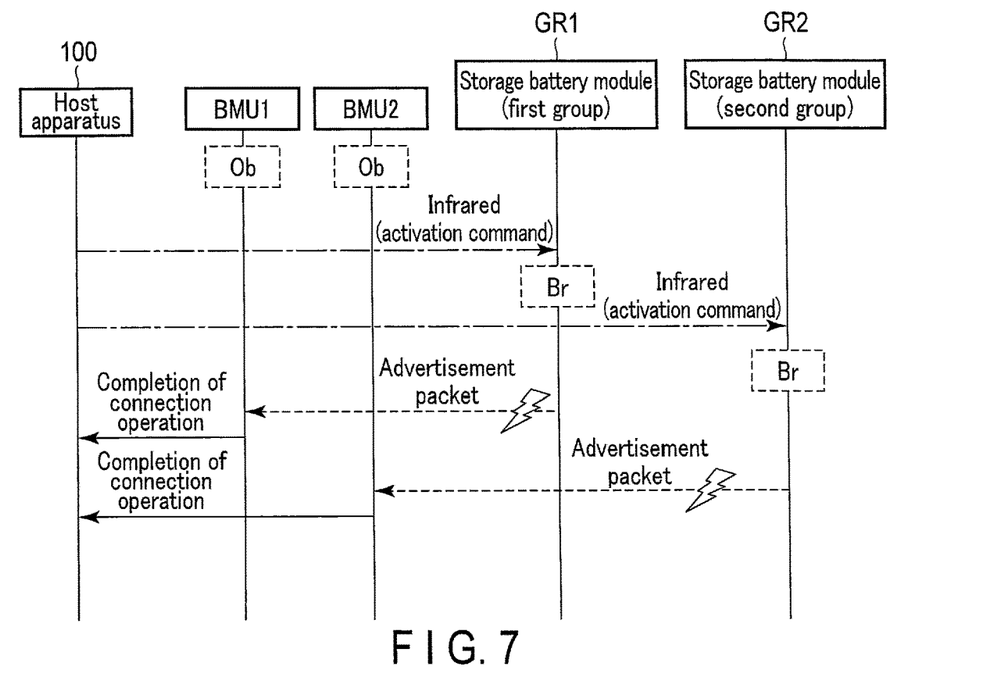
FIG. 7 is a timing chart for explaining an example of procedure of performing communication between the battery management unit and the plurality of storage battery modules in the storage battery apparatus of a fourth embodiment.

FIG. 7 is a timing chart for explaining an example of procedure of performing communication between the battery management unit and the plurality of storage battery modules in the storage battery apparatus of the fourth embodiment.

In the present embodiment, for example, an example of the operation of the storage battery apparatus in a case where the plurality of storage battery modules MDL is divided into a first group GR1 to be managed by the battery management unit BMU1 and a second group GR2 to be managed by the battery management unit BMU2, and connection is established in parallel for the group of the plurality of storage battery modules MDL will be described.

First, the wireless communication modules BLE1 to BLE4 of the battery management units BMU1 and BMU2 are set as observers (Ob), and the plurality of storage battery modules MDL put the infrared receivers 40 into a standby state, and put components other than the infrared receivers 40 in a state where the components are not activated.

The host apparatus 100 causes the infrared transmitter to output an infrared signal for activating the plurality of storage battery modules MDL in the first group GR1, and causes the infrared transmitter 30 to output an infrared signal for activating the plurality of storage battery modules MDL in the second group GR2 after a predetermined period has elapsed. In this event, the host apparatus 100 causes the infrared transmitter 30 to output the infrared signal for activating the plurality of storage battery modules MDL in the second group GR2 even before the host apparatus 100 receives a notification that the connection operation is completed from the battery management unit BMU1.

The storage battery apparatus of the present embodiment is similar to the storage battery apparatus in the above-described first embodiment except for the above-described operation of the host apparatus 100. That is, in the storage battery apparatus of the present embodiment, there is a period in which a connection between the battery management unit BMU1 and the storage battery module MDL in the first group GR1 and a connection between the battery management unit BMU2 and the storage battery module MDL in the second group are established in parallel.

A timing at which the host apparatus 100 activates the plurality of storage battery modules MDL in the first group GR1 is different from a timing at which the host apparatus activates the plurality of storage battery modules MDL in the second group GR2, and thus, a time difference occurs between a timing at which the storage battery module MDL in the first group GR1 transmits the advertisement packet and a timing at which the storage battery module MDL in the second group GR2 transmits the advertisement packet. This can prevent collision of the advertisement packets between the groups.

In the present embodiment, the advertisement packet which requests a connection is not transmitted from the plurality of battery management units BMU1 and BMU2, collision does not occur between the advertisement packet which requests the connection and the advertisement packet which responds to the connection request.

As a result, it is possible to shorten a period for completing connections between the battery management units BMU1 and BMU2 and the plurality of storage battery modules MDL, so that it is possible to shorten a period for causing a system to operate. In other words, according to the present embodiment, it is possible to provide a storage battery apparatus with high reliability.

Next, a storage battery apparatus according to a fifth embodiment will be described in detail with reference to the drawings.

The storage battery apparatus of the present embodiment is different from the storage battery apparatuses in the first to the fourth embodiments in that one battery management unit BMU manages a plurality of groups of storage battery modules MDL.

Figure 8A:
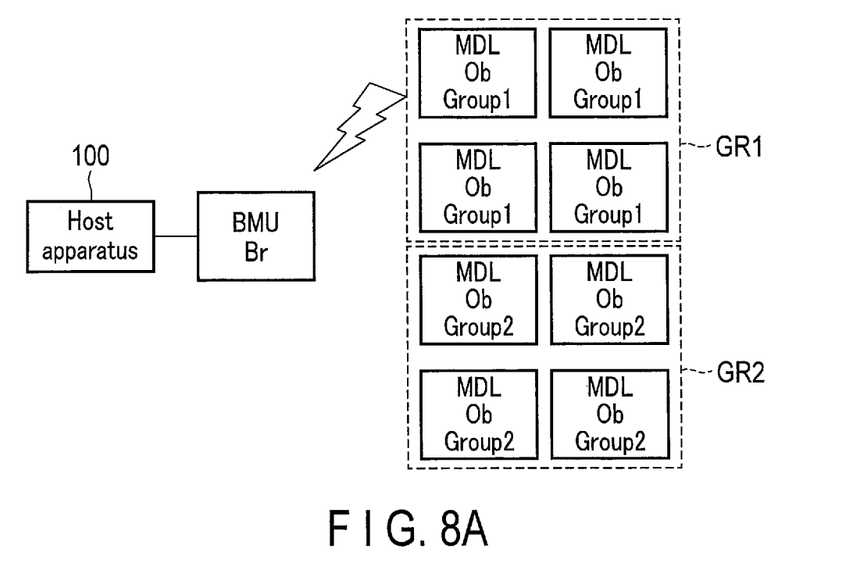
FIG. 8A is a diagram for explaining an example of procedure of performing communication between a battery management unit and a plurality of storage battery modules in the storage battery apparatus of a fifth embodiment.
Figure 8B:
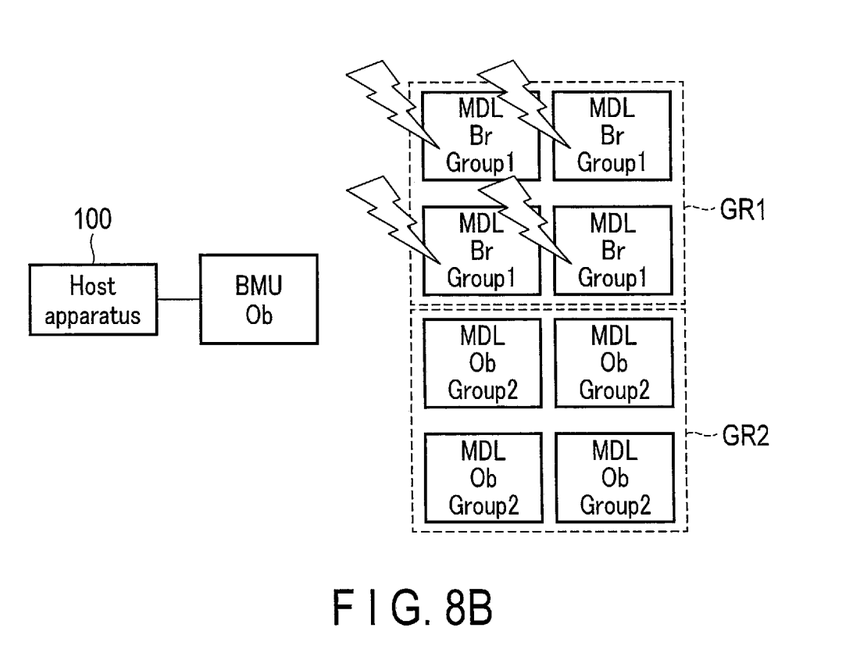
FIG. 8B is a diagram for explaining an example of procedure of performing communication between a battery management unit and a plurality of storage battery modules in the storage battery apparatus of the fifth embodiment.

FIGS. 8A and 8B are diagrams for explaining an example of procedure of performing communication between a battery management unit and a plurality of storage battery modules in the storage battery apparatus of the fifth embodiment.

Figure 9:
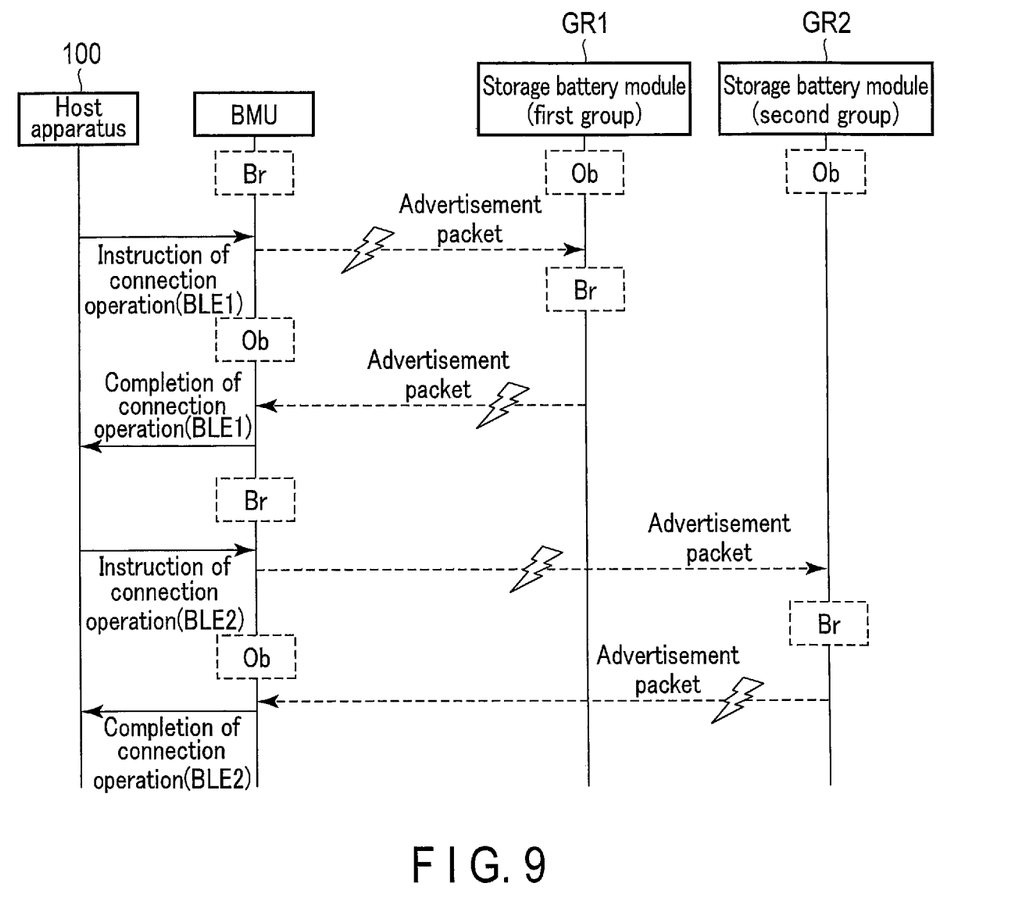
FIG. 9 is a timing chart for explaining an example of procedure of performing communication between the battery management unit and the plurality of storage battery modules in the storage battery apparatus of the fifth embodiment.

FIG. 9 is a timing chart for explaining an example of procedure of performing communication between the battery management unit and the plurality of storage battery modules in the storage battery apparatus of the fifth embodiment.

Here, for example, an example of operation of the storage battery apparatus in a case where the plurality of storage battery modules MDL is divided into the first group GR1 and the second group GR2 and connections with the battery management unit BMU are sequentially established for each group of the plurality of storage battery modules MDL will be described.

First, the wireless communication modules BLE1 to BLE4 of the battery management unit BMU are set as broadcasters (Br), and the wireless communication modules 20 of the plurality of storage battery modules MDL are set as observers (Ob).

The host apparatus 100 transmits a command which instructs the battery management unit BMU to perform connection operation with the storage battery modules MDL of the first group GR.

When the arithmetic processing apparatus C1 of the battery management unit BMU receives the instruction of the connection operation from the host apparatus 100, the arithmetic processing apparatus C1 transmits an advertisement packet via the wireless communication modules BLE1 to BLE4. In this event, the arithmetic processing apparatus C1 periodically transmits the advertisement packet via the wireless communication modules BLE1 to BLE4. The advertisement packet transmitted from the arithmetic processing apparatus C1 includes, for example, data indicating that a connection is requested to the storage battery module MDL in the first group GR1.

A cycle in which the advertisement packet is transmitted from each of the wireless communication modules BLE1 to BLE4 is controlled by an advertisement interval (T_advEvent). The advertisement interval is set by the above expression (1) using, for example, values of advInterval and advDelay. The advertisement interval is different among the plurality of wireless communication modules BLE1 to BLE4 depending on the value of advDelay which is randomly set, and thus, a timing at which the advertisement packet is transmitted is shifted, which can prevent packet collision.

A state of the battery management unit BMU changes from a state of the broadcaster to a state of the observer after a predetermined period has elapsed after the advertisement packet has been periodically transmitted.

The plurality of storage battery modules MDL is initially in the state of the observer (Ob), and can receive the advertisement packet. In a case where the cell monitoring unit C2 of the storage battery module MDL receives the advertisement packet via the wireless communication module 20, the cell monitoring unit C2 determines whether or not the advertisement packet is transmitted to the group to which the cell monitoring unit C2 belongs.

In a case where the cell monitoring unit C2 of the storage battery module MDL included in the first group GR1 receives the advertisement packet via the wireless communication module 20 and determines that the advertisement packet is transmitted to the storage battery module MDL in the first group GR, the state becomes the state of the broadcaster from the state of the observer.

Subsequently, the cell monitoring unit C2 of the storage battery module MDL included in the first group GR1 transmits the advertisement packet via the wireless communication module 20. In this event, the advertisement packet transmitted from the cell monitoring unit C2 includes, for example, data for identifying the plurality of storage battery modules MDL included in the first group GR1.

In this event, the battery management unit BMU is in a state of the observer and can receive the advertisement packet. In a case where the arithmetic processing apparatus C1 of the battery management unit BMU receives the advertisement packet via the wireless communication modules BLE1 to BLE4, the arithmetic processing apparatus C1 confirms whether the advertisement packet is transmitted from the storage battery module MDL included in the first group GR1.

In a case where the arithmetic processing apparatus C1 confirms that the packet is an advertisement packet from the storage battery module MDL to be managed, the arithmetic processing apparatus C1 allocates the packet to any one of the wireless communication modules BLE1 to BLE4, and sequentially performs connection operation with all the storage battery modules MDL in the first group GR1.

After the arithmetic processing apparatus C1 establishes connections with all the storage battery modules MDL in the first group GR1 to be managed, the arithmetic processing apparatus C1 notifies the host apparatus 100 that the connection operation has been completed.

For example, in a case where the advertisement packets are not received from all the storage battery modules MDL in the first group GR1 until a predetermined period elapses since the advertisement packet has been transmitted, the arithmetic processing apparatus C1 may notify the host apparatus 100 that the connection operation has been failed. In a case where connections cannot be established with all the storage battery modules MDL in the first group GR1 even if retry of the connection operation is performed a predetermined number of times, it is possible to notify the host apparatus 100 that the storage battery module MDL in the first group GR1 is abnormal.

In a case where the host apparatus 100 receives the notification that the connection operation has been completed from the arithmetic processing apparatus C1 of the battery management unit BMU1, the host apparatus 100 transmits a command instructing the battery management unit BMU to perform the connection operation.

The arithmetic processing apparatus C1 of the battery management unit BMU establishes connections with the storage battery modules MDL in the second group GR2 similarly to the connections with the storage battery modules MDL in the first group GR1.

As described above, it is possible to prevent collision of the advertisement packets by performing connection operation at different timings at one battery management unit BMU. In addition, the battery management unit BMU establishes connections with each group of the storage battery modules MDL, which results in reduction of the number of storage battery modules MDL that the battery management unit BMU establishes connections at once with, so that it is possible to prevent collision between the advertisement packet which requests a connection and the advertisement packet which responds to the connection request.

As a result, it is possible to shorten a period for completing connections between the battery management unit BMU and the plurality of storage battery modules MDL, so that it is possible to shorten a period for causing a system to operate. In other words, according to the present embodiment, it is possible to provide a storage battery apparatus with high reliability.

Next, a storage battery apparatus according to a sixth embodiment will be described in detail with reference to the drawings.

Figure 10A:
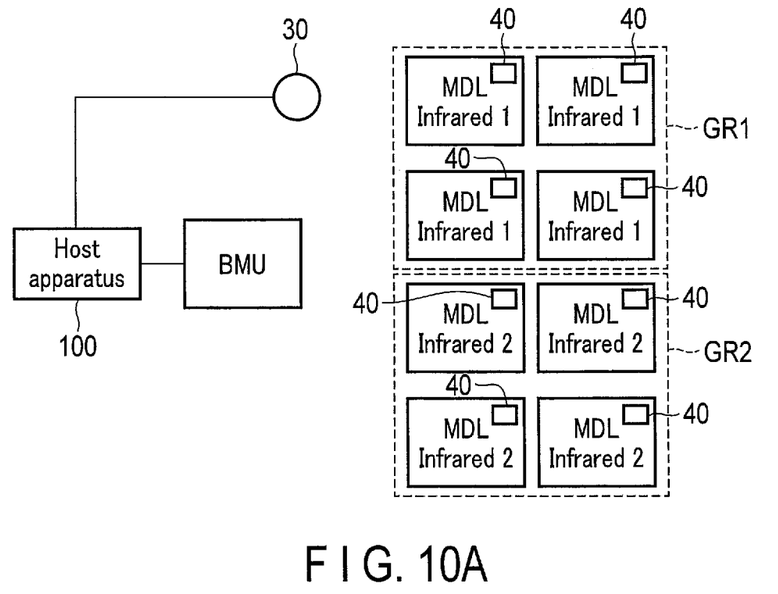
FIG. 10A is a diagram for explaining an example of procedure of performing communication between a battery management unit and a plurality of storage battery modules in the storage battery apparatus of a sixth embodiment.
Figure 10B:
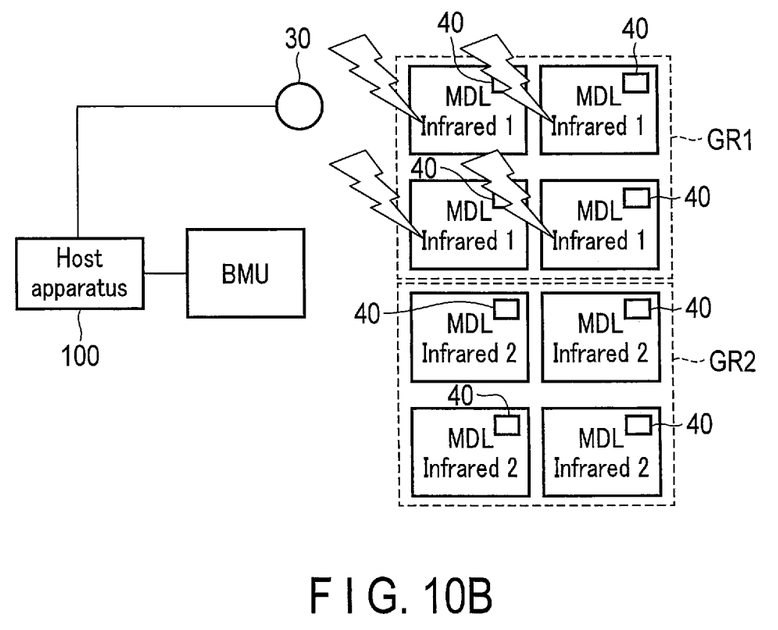
FIG. 10B is a diagram for explaining an example of procedure of performing communication between a battery management unit and a plurality of storage battery modules in the storage battery apparatus of the sixth embodiment.

FIGS. 10A and 10B are diagrams for explaining an example of procedure of performing communication between a battery management unit and a plurality of storage battery modules in the storage battery apparatus of the sixth embodiment.

In the storage battery apparatus of the present embodiment, it is different from the fifth embodiment described above on the point that the plurality of storage battery modules MDL further includes the infrared receivers 40. The infrared receivers 40 can receive infrared signals (for example, pulse position modulation (PPM) signals) transmitted from an infrared transmitter 30 of the host apparatus 100.

Figure 11:
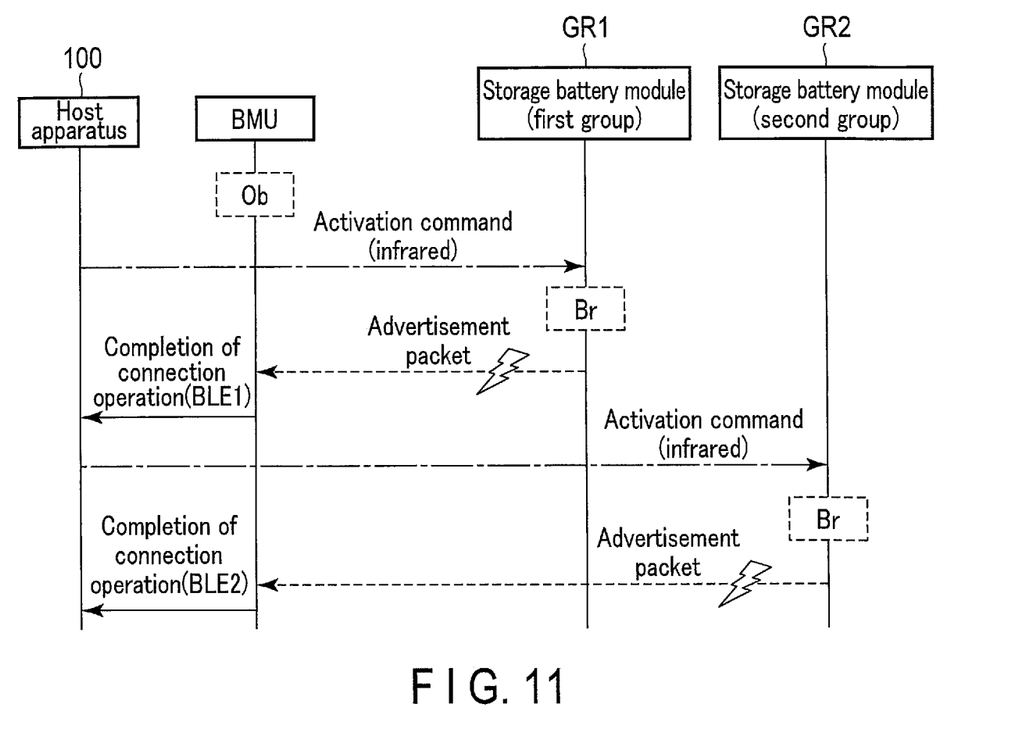
FIG. 11 is a timing chart for explaining an example of procedure of performing communication between the battery management unit and the plurality of storage battery modules in the storage battery apparatus of the sixth embodiment.

FIG. 11 is a timing chart for explaining an example of procedure of performing communication between the battery management unit and the plurality of storage battery modules in the storage battery apparatus of the sixth embodiment.

Here, for example, an example of operation of the storage battery apparatus in a case where the plurality of storage battery modules MDL is divided into the first group GR1 and the second group GR2, each group of the plurality of storage battery modules MDL are activated by the infrared signal, and connections with the battery management unit BMU are sequentially established will be described.

First, the wireless communication modules BLE1 to BLE4 of the battery management unit BMU are set as observers (Ob), and the plurality of storage battery modules MDL put the infrared receivers 40 into a standby state, and put components other than the infrared receivers 40 in a state where the components are not activated.

The host apparatus 100 outputs an infrared signal for activating the plurality of storage battery modules MDL in the first group GR1 from the infrared transmitter 30.

The plurality of storage battery modules MDL in the first group GR1 are energized by receiving the infrared signal from the host apparatus 100 by the infrared receiver 40, and the cell monitoring unit C2 and the wireless communication module 20 are activated. The wireless communication module 20 is in a state of a broadcaster (Br) when the storage battery module MDL is activated.

The cell monitoring unit C2 of the activated storage battery module MDL causes the wireless communication module 20 to transmit the advertisement packet. The advertisement packet is periodically transmitted from the wireless communication module 20.

A cycle in which the advertisement packet is transmitted from the wireless communication module 20 of the plurality of storage battery modules MDL is controlled by an advertisement interval (T_advEvent). The advertisement interval is set by the above expression (1) using, for example, values of advInterval and advDelay. Similarly to the first embodiment described above, the advertisement interval is different among the plurality of wireless communication modules 20 depending on the value of advDelay which is randomly set, and thus, a timing at which the advertisement packet is transmitted is shifted, which can prevent packet collision.

The battery management unit BMU is at first in a state of an observer (Ob) and can receive an advertisement packet. In a case where the arithmetic processing apparatus C1 of the battery management unit BMU receives the advertisement packet via the wireless communication modules BLE1 to BLE4, the arithmetic processing apparatus C1 determines whether or not the advertisement packet is transmitted from the storage battery module MDL in the first group GR1.

The battery management unit BMU receives the advertisement packet via the wireless communication module BLE1 to BLE4, determines that the advertisement packet is transmitted from the storage battery module MDL in the first group GR1, and notifies the host apparatus 100 that the connection operation of the storage battery modules MDL in the first group GR1 is completed in a case where the battery management unit BMU receives the advertisement packets from all the storage battery modules MDL in the first group GR1.

Subsequently, in order to establish connections between the plurality of storage battery modules MDL in the second group GR2 and the battery management unit BMU, the wireless communication modules BLE1 to BLE4 of the battery management unit BMU serve as observers (Ob).

The host apparatus 100 outputs an infrared signal for activating the plurality of storage battery modules MDL in the second group GR2 from the infrared transmitter 30.

The plurality of storage battery modules MDL in the second group GR2 are energized by receiving the infrared signal from the host apparatus 100 by the infrared receiver 40, and the cell monitoring unit C2 and the wireless communication module 20 are activated. The wireless communication module 20 is in a state of a broadcaster (Br) when the storage battery module MDL is activated.

The cell monitoring unit C2 of the activated storage battery module MDL causes the wireless communication module 20 to transmit the advertisement packet. The advertisement packet is periodically transmitted from the wireless communication module 20.

A cycle in which the advertisement packet is transmitted from the wireless communication module 20 of the plurality of storage battery modules MDL is controlled by an advertisement interval (T_advEvent). The advertisement interval is set by the above expression (1) using, for example, values of advInterval and advDelay. Similarly to the first embodiment described above, the advertisement interval is different among the plurality of wireless communication modules 20 depending on the value of advDelay which is randomly set, and thus, a timing at which the advertisement packet is transmitted is shifted, which can prevent packet collision.

The battery management unit BMU is in a state of an observer (Ob) and can receive an advertisement packet. In a case where the arithmetic processing apparatus C1 of the battery management unit BMU receives the advertisement packet via the wireless communication modules BLE1 to BLE4, the arithmetic processing apparatus C1 determines whether or not the advertisement packet is transmitted from the storage battery module MDL in the second group GR2.

The battery management unit BMU receives the advertisement packet via the wireless communication module BLE1 to BLE4, determines that the advertisement packet is transmitted from the storage battery module MDL in the second group GR2, and notifies the host apparatus 100 that the connection operation of the storage battery modules MDL in the second group GR2 is completed in a case where the battery management unit BMU receives the advertisement packets from all the storage battery modules MDL in the second group GR2.

For example, in a case where the advertisement packets are not received from all the storage battery modules MDL in the group to which the storage battery module MDL indicated by the initially received advertisement packet belongs until a predetermined period elapses since the first advertisement packet has been received, the arithmetic processing apparatus C1 may notify the host apparatus 100 that the connection operation has been failed. In a case where connections cannot be established with all the storage battery modules MDL in the group to which the storage battery module MDL indicated by the initially received advertisement packet belongs even if retry of the connection operation is performed a predetermined number of times, it is possible to notify the host apparatus 100 that the storage battery module MDL to be managed is abnormal.

As described above, it is possible to prevent collision of the advertisement packets by performing connection operation at different timings at one battery management unit BMU. In the present embodiment, the advertisement packet which requests a connection is not transmitted from the plurality of battery management unit BMU, collision does not occur between the advertisement packet which requests the connection and the advertisement packet which responds to the connection request.

As a result, it is possible to shorten a period for completing connections between the battery management unit BMU and the plurality of storage battery modules MDL, so that it is possible to shorten a period for causing a system to operate. In other words, according to the present embodiment, it is possible to provide a storage battery apparatus with high reliability.

In the plurality of embodiments described above, one or a plurality of battery management units can start monitoring the measurement values of the voltage and the temperature in order from the storage battery module MDL with which communication is established. Thus, for example, in a case where there is the storage battery module MDL in an overvoltage or overtemperature state, it is possible to detect that the storage battery apparatus is in an abnormal state before communication with all the storage battery modules MDL is established.

For example, in a case where connections are simultaneously made with all the storage battery modules MDL, monitoring of the voltage and the temperature is started after communication with all the storage battery modules MDL is established, which may delay a measure for ensuring safety of the storage battery apparatus in a case where there is a storage battery module MDL in an abnormal state and may lead to a large accident. On the other hand, in the plurality of embodiments described above, the plurality of storage battery modules MDL is connected for each group, it is possible to take a measure for securing safety of the storage battery apparatus for the storage battery module MDL in the group with which the communication is established, so that it is possible to take a quick response.

In the plurality of embodiments described above, in a case where the battery management unit includes a plurality of wireless communication modules, the connection operation may be performed while the group of the storage battery modules is associated with each wireless communication module. For example, connections may be made with the storage battery modules MDL in the first group GR1 by the wireless communication modules BLE1 and BLE2, and connections may be made with the storage battery modules MDL in the second group GR2 by the wireless communication modules BLE3 and BLE4. Even in this case, the same effects as the effects in the plurality of embodiments described above can be obtained.

Although some embodiments of the present invention have been described, these embodiments have been presented as examples, and are not intended to limit the scope of the invention. These novel embodiments can be implemented in various other forms, and various omissions, substitutions, and changes can be made without departing from the gist of the invention. These embodiments and modifications thereof are included in the scope and gist of the invention and are included in the invention recited in the claims and the equivalent scope thereof.

What is claimed is:

1. A storage battery apparatus comprising:
a plurality of storage battery modules, each of which includes a battery module including a plurality of battery cells, a first wireless communication module configured to transmit and receive a radio wave based on a BLE standard, and a cell monitoring unit configured to measure a voltage of the battery cell and a temperature of at least one portion of the battery module and control operation of the first wireless communication module; and
a battery management unit which includes a plurality of second wireless communication modules configured to transmit and receive a radio wave based on the BLE standard, and an arithmetic processing apparatus configured to control operation of the second wireless communication modules,
wherein the arithmetic processing apparatus is configured to divide the plurality of storage battery modules into a plurality of groups each including at least one of the storage battery modules, and to establish communication between the battery management unit and the storage battery modules in unit of the group according to an external command,
wherein the plurality of groups includes a first group and a second group, and
the arithmetic processing apparatus is further configured to establish connections with the storage battery modules by receiving an advertisement packet as an observer after transmitting an advertisement packet which requests a connection as a broadcaster, and to start operation of connections with the storage battery modules included in the second group after communication with all the storage battery modules included in the first group is established.

* * * * *